United States Patent [19]

Jeong

[11] Patent Number: 5,095,227
[45] Date of Patent: Mar. 10, 1992

[54] MOS TRANSISTOR TEMPERATURE DETECTING CIRCUIT

[75] Inventor: Tae-sung Jeong, Seoul, Rep. of Korea

[73] Assignee: Samsung Electronics Co., Ltd., Kyunggi-do, Rep. of Korea

[21] Appl. No.: 392,215

[22] Filed: Aug. 10, 1989

[30] Foreign Application Priority Data

May 23, 1989 [KR] Rep. of Korea ............... 89-6893[U]

[51] Int. Cl.$^5$ .................. H01L 31/00; H03K 3/26
[52] U.S. Cl. ................... 307/310; 307/231; 307/571; 374/185
[58] Field of Search .............. 307/310, 571, 231; 374/178, 185, 183; 357/25, 28, 59 D, 59 F

[56] References Cited

U.S. PATENT DOCUMENTS

| | | | |
|---|---|---|---|
| 4,034,395 | 7/1977 | Abdelrahman | 357/28 |
| 4,047,436 | 9/1977 | Bernard et al. | 357/28 |
| 4,281,544 | 8/1981 | Kaneko | 374/185 |
| 4,504,743 | 3/1985 | Aoyama et al. | 307/310 |
| 4,652,144 | 3/1987 | Günther et al. | 307/310 |
| 4,699,520 | 10/1987 | Wallenfang | 307/310 |
| 4,762,801 | 8/1988 | Kapoor | 357/59 |
| 4,808,847 | 2/1989 | Van Kessel | 307/310 |

FOREIGN PATENT DOCUMENTS

| | | | |
|---|---|---|---|
| 0240951 | 11/1986 | German Democratic Rep. | 374/185 |
| 0164320 | 12/1980 | Japan | 307/310 |
| 0190799 | 8/1986 | Japan | 307/310 |
| 0284720 | 11/1989 | Japan | 374/185 |
| 0883762 | 11/1981 | U.S.S.R. | 307/310 |

OTHER PUBLICATIONS

Jaeger et al., "Integrated MOS Temperature Sensor", IEE Conference: Nashville, Tenn., Apr., 1980, pp. 161-162.

Primary Examiner—Timothy P. Callahan
Attorney, Agent, or Firm—Cushman, Darby & Cushman

[57] ABSTRACT

A semiconductor temperature detecting circuit is provided having a plurality of pairs of a MOS transistor for supplying current and a polycrystalline silicon resistor connected in series thereto. Each such pair is connected in between a first and a second power supply line. The voltage across the terminals of each polycrystalline silicon resistor is converted to a digital logic value and the combination of all such digital outputs represents the detected temperature. Each current supply transistor has its gate electrode connected to a common circuit which sets the current supply. The current setting circuit includes two p-channel MOS transistors and two n-channel MOS transistors. Each p-channel transistor in the current setting circuit has a current electrode connected to one power supply line and another current electrode connected to a current electrode of a corresponding n-channel transistor. Each n-channel transistor has its other current electrode connected to the other power supply line. One of the p-channel transistors has its gate electrode connected to a common point between one of its current electrodes and a corresponding n-channel transistor, and the circuit output is taken from that gate electrode. The other p-channel transistor has its gate electrode connected to the power supply line connected to the n-channel transistors, and its current electrode connecting to a corresponding n-channel transistor is also commonly connected to the gate electrode of the two n-channel transistors.

18 Claims, 3 Drawing Sheets

MOS TRANSISTOR TEMPERATURE DETECTING CIRCUIT

FIELD OF THE INVENTION

The present invention relates to a semiconductor temperature detecting circuit, and particularly to a semiconductor temperature detecting circuit which is suitable for use in ultra-high density MOS semiconductor devices, and which requires very low power consumption.

BACKGROUND OF THE INVENTION

Generally, semiconductor devices are very sensitive to temperature, and their properties are easily affected by temperature. MOS type transistors, however, have negative temperature characteristics in the effective carrier mobility within their channels. For that reason, they are not susceptible to a thermal runaway condition as are bipolar transistors. Therefore, MOS type transistors are relatively less sensitive to variation in temperature.

Ordinarily with CMOS devices, one need not be much concerned about temperature dependent characteristics, unlike the case with bipolar devices. Nevertheless, when the level of power consumption becomes relatively high, a designer has to consider at the designing stage factors such as the decrease of the conductance due to a rise in temperature, the lowering of the maximum operating frequency due to a decrease in the conductance, and a variation of the threshold voltage.

Particularly, in designing ultra-high density semiconductor devices with complicated structure one has to give serious consideration to the effect of temperature. Thus, the options available to the designer are restricted in many respects.

So far, in ultra-high density MOS semiconductor devices, property compensations for different temperature levels have not been practiced at all. Temperature compensation has been available only for intrinsic properties of some kinds of semiconductor devices. In any event, those methods have been applied only to a part of a device or to special circuits. Their application has been extremely limited.

However, in light of continuing efforts to achieve higher density, finer structure, higher performance, etc., power consumption requirements have increased. Consequently, a device including compensation in the form of variations in operating characteristics responsive to variations in temperature, and a suitable temperature detecting circuit would be desirable.

SUMMARY OF THE INVENTION

It is an object of the present invention to provide a semiconductor temperature detecting circuit suitable for installation in a semiconductor device.

It is another object of the present invention to provide a device for detecting semiconductor temperature by use of polycrystalline silicon.

It is still another object of the present invention to provide a semiconductor temperature detecting circuit which consumes minimum power.

It is still another object of the present invention to provide a semiconductor temperature detecting circuit which detects variations in semiconductor temperature by a digital method.

It is a further object of the present invention to implement any one or more of the foregoing objectives.

According to one aspect of the invention, a current supply and a temperature sensitive source of resistance (resistor) are interconnected in series. The interconnected combination is connected between a first power supply line and a second power supply line and the voltage across the source of resistance is outputted as a temperature detection signal. The outputted voltage varies in response to the surrounding temperature of the source of resistance.

In accordance with another aspect of the invention, a plurality of pairs of a current supply and a corresponding serially connected temperature sensitive source of resistance are connected in parallel to each other, between a first power supply line and a second power supply line. In that arrangement, a plurality of different electrical signals indicative of temperature are separately obtained.

BRIEF DESCRIPTION OF THE DRAWINGS

The above objects and advantages of the present invention will become more apparent by describing the preferred embodiments of the present invention with reference to the attached drawings in which.

DESCRIPTION OF THE PREFERRED EMBODIMENTS

Figure 1:
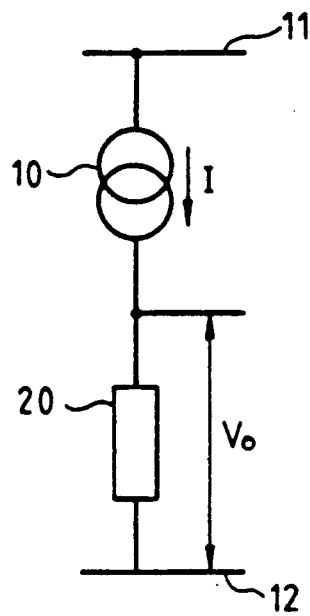
FIG. 1 is a schematic illustration of the present invention.

FIG. 1 is a schematic illustration of the circuit of the present invention. A current supply 10 and a temperature sensitive source of resistance made of polycrystalline silicon (polycrystalline silicon resistor) interconnected in series are connected between a first power supply line 11 and a second power supply line 12. The voltage across the terminals of the polycrystalline silicon resistor 20 is sensitive to variations of the semiconductor temperature and is outputted as the temperature detecting signal.

Polycrystalline silicon which is not doped with an impurity or is lightly doped has a very high resistance value. In such a material, the variation in resistance against temperature is enormously large and is represented by an exponential function. For example, in the temperature range between 273° to 343° K., the resistance valve can vary up to several thousand times. Also, polycrystalline silicon which is ion-implanted with an impurity such as antimony, phosphorus, arsenic, boron and the like shows a very high resistance value due to the carrier trap at grain boundaries.

The drain current of a MOS transistor in the subthreshold voltage decreases in the form of an exponential function when the gate voltage is below the threshold. By using the resistance-temperature characteristics of polycrystalline silicon and the subthreshold region current of MOS transistors, a circuit for detecting semiconductor temperature can be formed and which is most suitable for installation in ultra-high density semiconductor devices.

Moreover, compared to variation in resistance due to temperature in polycrystalline silicon, the variation in subthreshold current is negligible. Thus, temperature variation can be detected with great reliability. The extremely small subthreshold current also causes the subject invention to consume very little current.

It should be noted that this invention is not limited to the use of polycrystalline silicon as the temperature dependant source of resistance. Any alternative material of which the variation in resistance versus changes in temperature reflects an exponential function, as does polycrystalline silicon, can be employed. Such a material should also be suitable manufacturing by semiconductor manufacturing. Polycrystalline silicon is merely one preferred selection.

Figure 2:
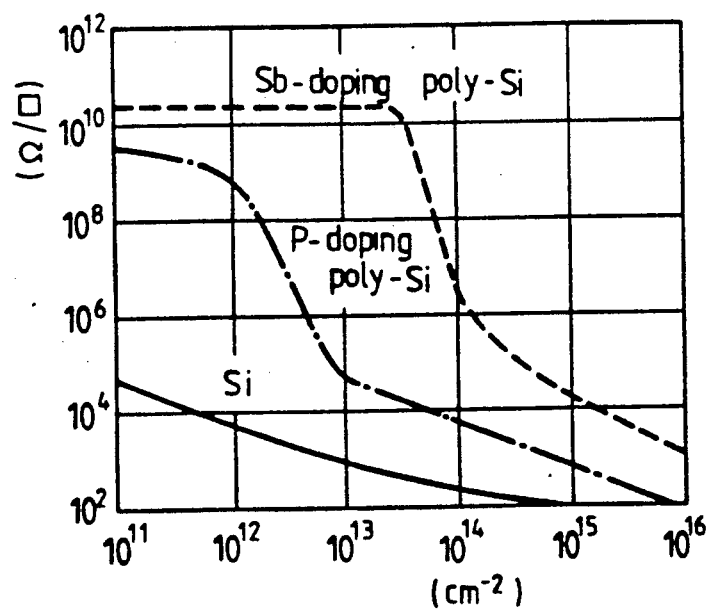
FIG. 2 is an illustration of the variation in sheet resistance of polycrystalline silicon at different levels of ion implantation of an impurity.

FIG. 2 is a graphical illustration of the variation in the sheet resistance of polycrystalline silicon versus the level of ion-implantated impurity. In this case, the impurity is either antimony or phosphorus or the like and is implanted into a polycrystalline silicon of 5000 Å with an energy of 30 KeV.

As shown in the graph, in the case wherein antimony is used, the sheet resistance amounts to several mega ohm/square or to tens of giga ohm/square below the ion-implantation range of $10^{14} cm^{-2}$. When the ambient temperature is varied from 273° K. to 343° K., for example, the resistance value of such a polycrystalline silicon is decreased by several hundred or several thousand times in the form of an exponential function. The current supply should supply currents for obtaining the desired output signals in accordance with the resistance value of the polycrystalline silicon.

Figure 3:
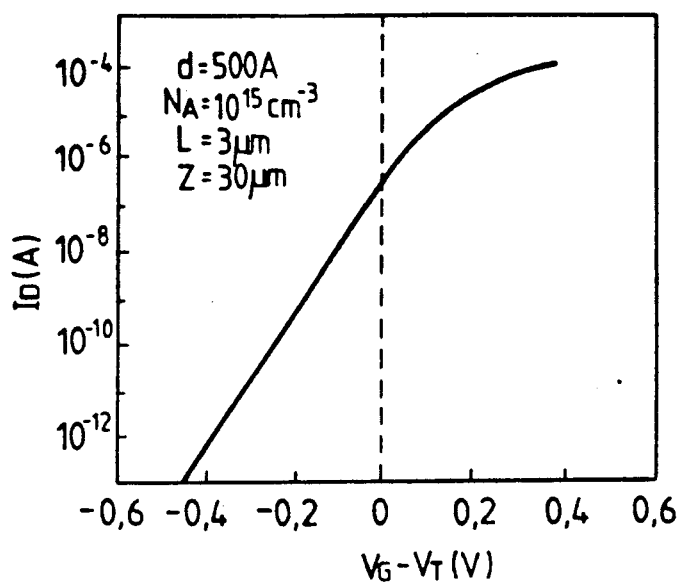
FIG. 3 is an illustration of the subthreshold characteristics of MOS transistors.

FIG. 3 illustrates the subthreshold characteristics of MOS transistors.

Figure 4:
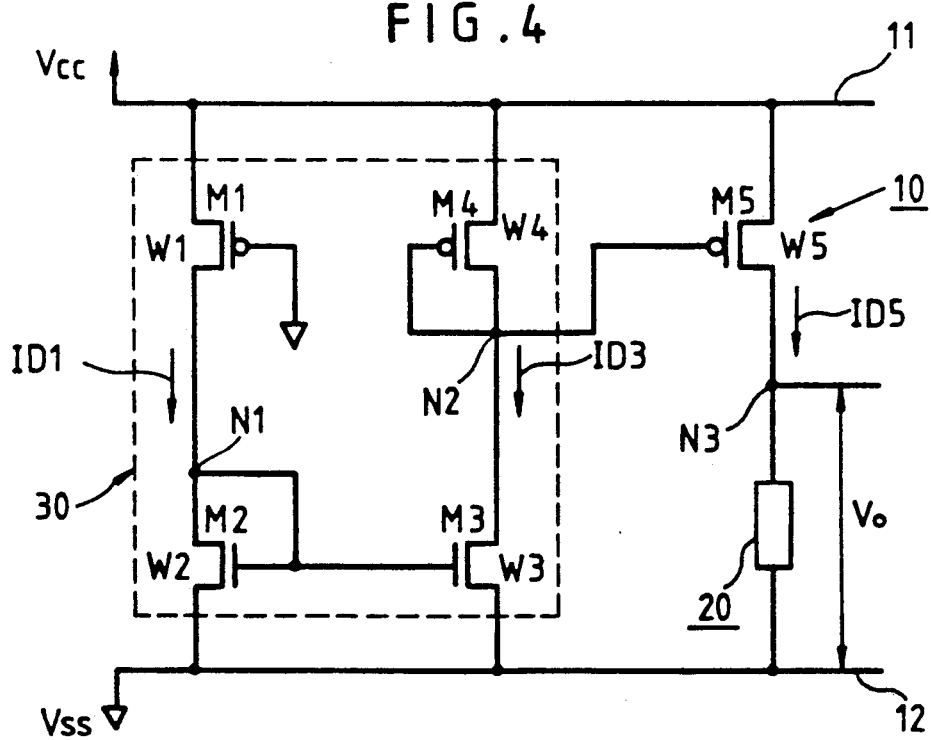
FIG. 4 is an illustration of an embodiment of the present invention.

FIG. 4 illustrates a particular embodiment of the present invention. In this embodiment, current supply 10 is a p-channel MOS transistor M5 which can be operated in the subthreshold region.

The source of the P-channel MOS transistor M5 is connected to the first power supply line 11, the drain of M5 is connected to a third node N3, and the gate of M5 is connected to a current setting circuit 30 through node N2. One of the terminals of the polycrystalline silicon resistor 20 is connected to the third node N3, and the other terminal is connected to the second power supply line 12.

The current setting circuit 30 includes two p-channel MOS transistors and two n-channel MOS transistors. The source of a first p-channel MOS transistor M1 is connected to the first power supply line 11; the gate of it is connected to the second power supply line 12; and the drain of it is connected to the first node N1. The drain current ID1 of M1 is supplied to the first node N1.

The drain and gate of a second n-channel MOS transistor M2 are connected commonly to the first node N1, and the source of it is connected to the second power supply line 12. The ratio between the geometrical sizes of the first and second MOS transistors is to satisfy the formula, W1< <W2 (L1−L2), so that the second MOS transistor M2 should be operable in the subthreshold region. The M2 transistor is geometrically larger than the M1 transistor.

The drain of a third n-channel MOS transistor M3 is connected to the second node N2; the source of it is connected to the second power supply line 12; and the gate of it is connected to the first node N1 so that it should have the same bias voltage as that of the second MOS transistor. Accordingly, the third MOS transistor M3 is made to be operable in the subthreshold region regardless of the channel width thereof. The M3 transistor is geometrically smaller than the M2 transistor. The drain current ID3 of the third MOS transistor is defined as follows:

$$ID3 = ID1 \frac{W3}{W2}$$

(provided that $W3 < < W2$ and $L3 - L2$)
HERE

The gate and drain of a fourth p-channel MOS transistor M4 are commonly connected to the second node N2, and the source of it is connected to the first power supply line 11. The ratio between the geometrical sizes of the third and fourth MOS transistors M3, M4 is made to satisfy the formula W3< <W4(L3−L4), so that the said fourth MOS transistor M4 should be operable in the subthreshold region. The M4 transistor is geometrically larger than the M3 transistor.

The gate of p-channel MOS transistor M5 of current supply 10 is connected to the gate of the fourth MOS transistor M4. Accordingly, M5 is made to have the same gate voltage as that of the fourth MOS transistor M4, such that M5 is made operable in the subthreshold region. The ratio between the geometrical sizes of the fourth and fifth MOS transistors M4, M5, is made to satisfy W4>> W5(L4−L5). Thus, the drain current ID5 of the p-channel MOS transistor M5 (fifth transistor) is set based on the following formula:

$$ID5 = ID1 \frac{W3}{W2} \frac{W5}{W4}$$

where IDI represents the drain current of the first MOS transistor, and W2-W5 the channel widths of the respective MOS transistor.

The drain of the fifth MOS transistor can have a negligible amount of current compared with the drain current of the first MOS transistor, especially in light of the geometrical sizes of the second to fifth MOS transistors. Also, the current supply is not affected by temperature variation and the method of manufacturing.

The output voltage VO in the embodiment of the present invention as illustrated in FIG. 4 can be defined by the following formula:

$$VO = ID5 \times RT(K)$$

where RT(K) represents the resistance values of the polycrystalline silicon for different temperature levels.

Figure 5:
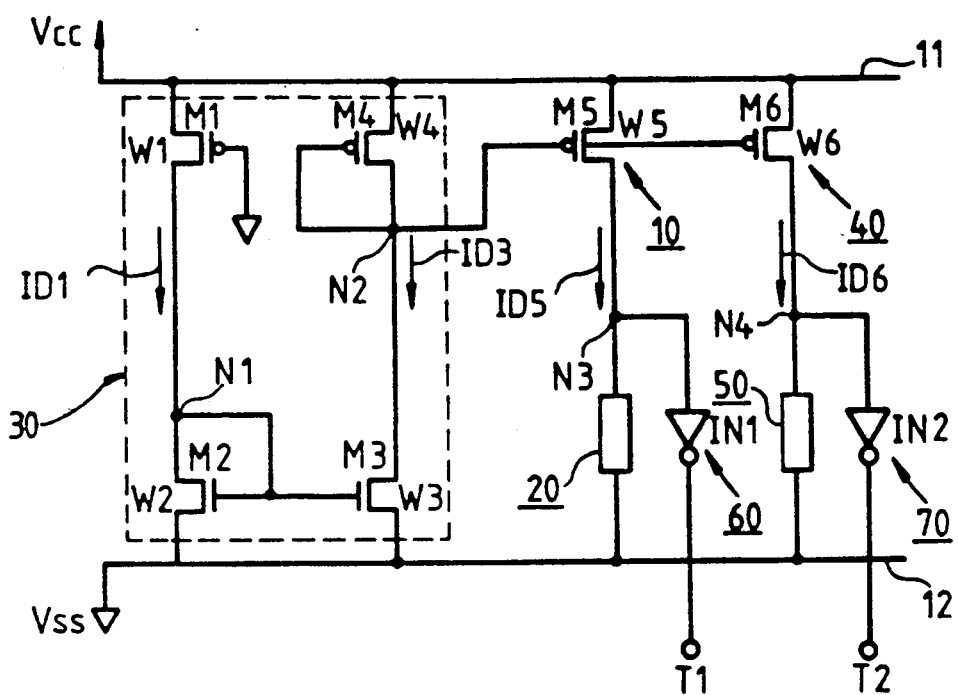
FIG. 5 is an illustration of another embodiment of the present invention.

FIG. 5 illustrates a preferred embodiment of the present invention. In this embodiment there are two pairs of a current supply and a corresponding serially connected polycrystalline silicon resistor, connected in parallel with respect to each other between the first power supply line 11 and the second power supply line 12. The first pair includes polycrystalline silicon resistor 20 and a P-channel MOS transistor M5 (first current supply 10), and the second pair includes polycrystalline silicon resistor 50 and a sixth MOS transistor M6 (second current supply 40). The gates of MOS transistors M5 and M6 are commonly connected to the gate of the fourth MOS transistor M4 of the current setting circuit 30 which is the same as that shown in FIG. 4.

Node N3 connects MOS transistor M5 with polycrystalline silicon resistor 20. Node N4 connects MOS transistor M6 with polycrystalline silicon resistor 50. Nodes N3 and N4 are respectively connected through digital converter circuits 60, 70 to output terminals T1 and T2.

The digital converter circuits 60, 70, can be inverters IN1 and IN2, preferably CMOS. The drain currents ID5, ID6 of the MOS transistors M5, M6 are governed by the following formulas:

$$ID5 = ID1 \frac{W3}{W2} \frac{W5}{W4}$$

$$ID6 = ID1 \frac{W3}{W2} \frac{W6}{W4}$$

provided that $W3 \ll W2$, $W5 \ll W4$, $W6 \ll W4$, and $W5 < W6$.

If the resistances of the first and second polycrystalline silicon resistance elements 20, 50 are set at the same value, then the node voltages VN3, VN4 of N3 and N4 will be defined by the following formulas:

$$VN3(T) = ID5 \times RT1(T)$$

$$VN4(T) = ID6 \times RT2(T)$$

RT1 represents the resistance value of the first polycrystalline silicon at T. K, and RT2 represents the resistance value of the second polycrystalline silicon at T. K. If the temperatures are equal in kelvin, then $ID5 < ID6$ and $VN3(T) < VN4(T)$.

Figure 6:
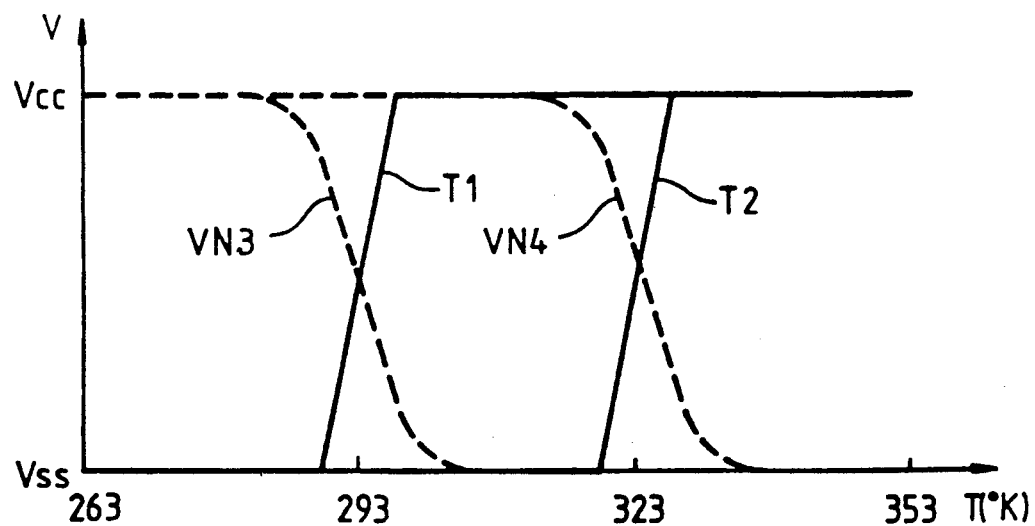
FIG. 6 is an illustration of the temperature-output characteristics of the circuit of FIG. 5.

The output state of the output terminals T1, T2 will be varied as shown in Table 1 below, if, for example, settings are made such that the node voltage VN3 should reach the predetermined trip voltage level of the first inverter IN1 at 293° K.(20° C.), (the first dotted wave pattern in FIG. 6), and that the node voltage VN4 should reach the predetermined trip voltage level of the second inverter IN2 at 323° K. (50° C.)(the second dotted wave pattern in FIG. 6).

TABLE 1

| Output terminal | Temp. (°K.) | | |
|---|---|---|---|
| | 263-293 | 293-323 | 323-355 |
| T1 | L | H | H |
| T2 | L | L | H |

Thus, the surrounding temperature can be detected digitally.

In setting the detection temperature for detecting the surrounding temperature digitally, an alternative method would be to make equal the geometrical sizes of the MOS transistors of the respective current supplies, and to vary the resistance values of the respective polycrystalline silicon resistors. The resistance values of the polycrystalline silicon resistors can be varied by varying their geometrical size, or by performing ion-implantation of an impurity at different levels.

As described above, the present invention is especially suitable for installation in ultra-high density semiconductor devices, particularly when polycrystalline silicon, a material well suited for semiconductor manufacturing processing, is used as the source of resistance. Furthermore, the subthreshold currents of MOS transistors can be set by the ratio between the geometrical sizes of MOS transistors. Consequently, the present invention requires a low power consumption, and can be designed in a manner unrelated to the manufacturing process and variations in temperature.

Also, because the surrounding temperature is detected by a digital method, the detection signals can be directly used without any further conversion or processing. Because of the above described advantages of the present invention, designers of semiconductor devices can exercise a wider discretion in designing ultra-high density semiconductor devices to overcome adverse effects of temperature rise.

What is claimed is:

1. A semiconductor temperature detecting circuit comprising:
   current supply means for supplying current, said current supply means comprising an MOS transistor biased in its subthreshold region;
   a temperature sensitive resistor formed of a material having an exponential relationship between resistance and temperature, said current supply means and said temperature sensitive resistor being interconnected in series between a first and a second power supply line, whereby the voltage across said temperature sensitive resistor is provided as an output signals indicative of the temperature detected.

2. A semiconductor temperature detecting circuit as claimed in claim 1, further comprising:
   current setting means for setting the drain current of said MOS transistor of said means for supplying current.

3. A semiconductor temperature detecting circuit comprising:
   current supply means for supplying current, said current supply means comprising an MOS transistor biased in its subthreshold region;
   a temperature sensitive resistor formed of a material having an exponential relationship between resistance and temperature, said current supply means and said temperature sensitive resistor being interconnected in series between a first and a second power supply line, whereby the voltage across said temperature sensitive resistor is provided as an output signal indicative of the temperature detected; and
   current setting means for setting the drain current of said MOS transistor of said means for supplying current, the current setting means comprising:
   a first MOS transistor of a first conduction type, wherein a first current electrode is coupled to the first power supply line, a control electrode is coupled to the second power supply line, and a second current electrode is coupled to a first node;
   a second MOS transistor of a second conduction type, wherein a first current electrode of the second MOS transistor and a control electrode of the second MOS transistor and a control electrode of the second MOS transistor are commonly coupled to said first node, and a second current electrode of the second MOS transistor is coupled to said second power supply line, said second MOS transistor having a geometrical size larger than that of said first MOS transistor so that the second MOS transistor is biased in its subthreshold region;
   a third MOS transistor of the second conduction type, wherein a control electrode of the third MOS transistor is coupled to the control electrode of said second MOS transistor, a first current electrode of the third MOS transistor is coupled to said second power supply line, and a second current electrode of the third MOS transistor is coupled to a second node, said third MOS transistor having a geometrical size smaller than that of said second MOS transistor; and a fourth MOS transistor of the first conduction type, wherein a first current electrode of the fourth MOS transistor is coupled to said first power supply line, and a control electrode of the fourth MOS transistor and a second current electrode of the fourth MOS transistor are commonly coupled to said second node, said fourth MOS transistor having a geometrical size larger than that of said third MOS transistor so that the fourth MSO transistor is biased in its subthreshold region, wherein the control electrode of said MOS transistor of said current supply means is connected to the control electrode of said fourth MOS transistor.

4. A semiconductor temperature detecting circuit as claimed in claim 3, wherein the MOS transistor of said current supply means has a geometrical size smaller than that of said fourth MOS transistor.

5. A semiconductor temperature detecting circuit comprising:
   a first and a second power supply line;
   a plurality of temperature detecting means for detecting a semiconductor temperature, each said temperature detecting means comprising current supply means for supplying current and a temperature sensitive resistor, each said current supply means including an MOS transistor biased in its subthreshold region, each said temperature sensitive resistor being formed of a material having an exponential relationship between resistance and temperature, in each said temperature detecting means, said current supply means and said temperature sensitive resistor of the same temperature detecting means being interconnected in series between said first and second power supply line;
   whereby each said detecting means respectively outputs an electrical signal in response to a temperature of the temperature sensitive resistor therein.

6. A semiconductor temperature detecting circuit as claimed in claim 5, wherein said MOS transistors of all said current supply means are responsive to a common current setting means for setting respective drain currents.

7. A semiconductor temperature detecting circuit comprising:
   a first and a second power supply line;
   a plurality of temperature detecting means for detecting a semiconductor temperature, each said temperature detecting means comprising current supply means for supplying current and a temperature sensitive resistor, each said current supply means including an MOS transistor biased in its subthreshold region, each said temperature sensitive resistor being formed of a material having an exponential relationship between resistance and temperature;
   in each said temperature detecting means, said current supply means and said temperature sensitive resistor of the same temperature detecting means being interconnected in series between said first and second power supply line;
   whereby each said detecting means respectively outputs an electrical signal in response to a temperature of the temperature sensitive resistor therein, comprising:

a first MOS transistor of a first conduction type, wherein a first current electrode is coupled to the first power supply line, a control electrode is coupled to the second power supply line, and a second current electrode is coupled to a first node;
   a second MOS transistor of a second conduction type, wherein a first current electrode of the second MOS transistor and a control electrode of the second MOS transistor are commonly coupled to said first node, and a second current electrode of the second MOS transistor is coupled to said second power supply line, said second MOS transistor having a geometrical size larger than that of said first MOS transistor so that the second MOS transistor is biased in its subthreshold region;
   a third MOS transistor of the second conduction type, wherein a control electrode of the third MOS transistor is coupled to the control electrode of said second MOS transistor, a first current electrode of the third MOS transistor is coupled to said second power supply line, and a second current electrode of the third MOS transistor is coupled to a second node, said third MOS transistor having a geometrical size smaller than that of said second MOS transistor; and
   a fourth MOS transistor of the first conduction type, wherein a first current electrode of the fourth MOS transistor is coupled to said first power supply line, and a control electrode of the fourth MOS transistor and a second current electrode of the fourth MOS transistor are commonly coupled to said second node, said fourth MOS transistor having a geometrical size larger than that of said third MOS transistor so that the fourth MOS transistor is biased in its subthreshold region;
   the control electrode of said MOS transistor of each said current supply means being connected to the control electrode of said fourth MOS transistor.

8. A semiconductor temperature detecting circuit as claimed in claim 7, wherein the MOS transistor of each said current supply means has a geometrical size different from that of each other whereby each said temperature detecting means outputs a different electrical signal in response to the temperature of the polycrystalline silicon resistor therein.

9. A semiconductor temperature detecting circuit as claimed in claim 7, wherein said polycrystalline silicon resistor of each said temperature detecting means has a resistance value different from that of each other, whereby each said temperature detecting means outputs a different electrical signal when the polycrystalline silicon resistor therein is at a certain temperature.

10. A semiconductor temperature detecting circuit comprising:
   a current supply means including at least one MOS transistor biased in the subthreshold region for supplying drain currents; and
   a temperature sensitive resistance means for restricting sad supplied drain currents in accordance with temperature variation,
   said current supply means and said temperature sensitive resistance means being connected in series between a first power supply line and a second power supply line;
   whereby the voltage across the terminals of said temperature sensitive resistance means is outputted as the temperature detection signal.

11. A semiconductor temperature detecting circuit as claimed in claim 10, wherein said temperature sensitive resistance means is formed of polycrystalline silicon.

12. A semiconductor temperature detecting circuit as claimed in claim 11, wherein said polycrystalline silicon is lightly doped with an impurity.

13. A semiconductor temperature detecting circuit as claimed in claim 12, wherein the doping of said impurity into the polycrystalline silicon is by ion implantation.

14. A semiconductor temperature detecting circuit as claimed in claim 13, wherein said impurity is antimony, phosphorus, arsenic, or boron.

15. A temperature detecting circuit for detecting a temperature of a portion of an ultra-high density semiconductor device, comprising:
   an MOS transistor permanently biased in its sub-threshold region, the MOS transistor having a current path between a source of the transistor and a drain of the transistor; and
   a temperature sensitive resistor formed of polycrystalline silicon, said temperature sensitive resistor being in thermal contact with said portion of said ultra-high density semiconductor device;
   wherein the current path of the MOS transistor is connected in series with the temperature sensitive resistor so that an output node is provided between the MOS transistor and temperature sensitive resistor.

16. The temperature detecting circuit of claim 15, wherein one of the source and the drain of the MOS transistor is connected to a first power supply line, and wherein the other of the source and drain of the MOS transistor is connected to one portion of the temperature sensitive resistor, and wherein another portion of the temperature sensitive resistor is connected to a second power supply line.

17. The temperature detecting circuit of claim 16, further comprising a buffer located on said ultra-high density semiconductor device, said buffer having an input connected to said output node.

18. The temperature detecting circuit of claim 17, wherein said polycrystalline silicon contains an ion implanted impurity.

* * * * *